(12) United States Patent
Frey

(10) Patent No.: US 6,314,041 B1
(45) Date of Patent: Nov. 6, 2001

(54) MEMORY WITH A REDUCED LEAKAGE CURRENT

(75) Inventor: Christophe Frey, Meylan (FR)

(73) Assignee: STMicroelectronics, S.A., Gentilly (FR)

( * ) Notice: Subject to any disclaimer, the term of this patent is extended or adjusted under 35 U.S.C. 154(b) by 0 days.

(21) Appl. No.: 09/553,638

(22) Filed: Apr. 20, 2000

(30) Foreign Application Priority Data

Apr. 30, 1999 (FR) .................................................. 99 05726

(51) Int. Cl.[7] .................................................. G11C 7/00
(52) U.S. Cl. .......................................... 365/229; 365/227
(58) Field of Search .................................. 365/154, 156, 365/104, 229, 227, 226

(56) References Cited

U.S. PATENT DOCUMENTS

| | | | |
|---|---|---|---|
| 5,581,500 | * 12/1996 | D'Souza | 365/154 |
| 5,583,457 | 12/1996 | Horiguchi et al. | 326/121 |
| 5,715,191 | 2/1998 | Yamauchi et al. | 365/156 |
| 5,732,015 | * 3/1998 | Kazerounian et al. | 365/154 |
| 5,734,622 | 3/1998 | Furumochi et al. | 365/233.5 |
| 5,894,433 | 4/1999 | Itoh et al. | 365/154 |

OTHER PUBLICATIONS

French Search Report from French Patent Application 99 05726, filed Apr. 30, 1999.

* cited by examiner

*Primary Examiner*—David Nelms
*Assistant Examiner*—Thong Le
(74) *Attorney, Agent, or Firm*—Wolf, Greenfield & Sacks, P.C.; James H. Morris; Theodore E. Galanthay

(57) ABSTRACT

A SRAM including an array of memory cell lines and columns, each column being supplied between a high supply voltage and a low supply voltage, which includes at least one MOS transistor in series with each column, and circuitry for applying to the at least one MOS transistor a turn-off control signal to enter a stand-by mode, whereby the overall resistance of the column and of the at least one transistor increases in stand-by mode.

8 Claims, 6 Drawing Sheets

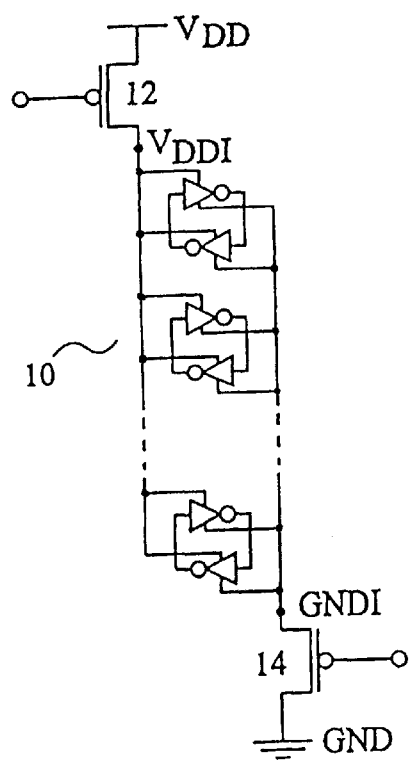 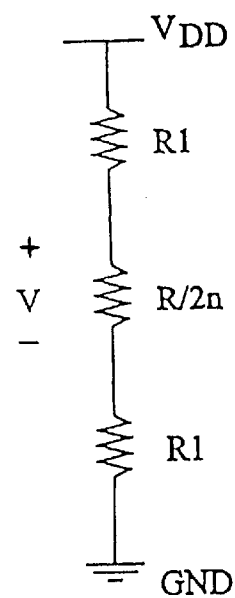
FIG. 5
FIG. 6

MEMORY WITH A REDUCED LEAKAGE CURRENT

BACKGROUND OF THE INVENTION

1. Field of the Invention

The present invention relates to SRAMs, and more specifically to means for setting such memories to a power consumption stand-by mode when these memories do not have to be used, either in the write or in the read mode.

2. Discussion of the Related Art

FIG. 1 schematically shows a static memory point having a conventional structure. Memory point 1 includes inverters 2 and 4 connected in anti-parallel. The respective inputs of inverters 2 and 4 are connected to respective bit lines BL1, BL2 via switches 8, respectively controlled by row selection signals WL1 and WL2. Each inverter is supplied between a high voltage $V_{DD}$ and a low voltage GND, currently, the ground. It should be noted that from the point of view of their supply, inverters 2 and 4 are in parallel.

To write an item of data in memory point 1, a voltage $V_{DD}$ is applied on one of bit lines BL1, BL2 and a voltage GND is applied on the other. Then, switches 8 are closed to set the state of the inputs and outputs of inverters 2 and 4. The switches are then opened and the state of the signals across the inverters is maintained.

To read an item of data from memory point 1, each of bit lines BL1, BL2 is precharged to a median voltage included between voltages $V_{DD}$ and GND, then switches 8 are closed so that the voltages present at the output of inverters 2 and 4 increase or decrease the bit line voltage. A read amplifier (not shown) connected to the bit lines amplifies these voltage variations and provides a binary information in relation with the data stored in the memory point.

FIG. 2 shows an embodiment of memory point 1 of FIG. 1. Inverter 2 includes a P-channel MOS transistor PMOS2, in series with an N-channel MOS transistor NMOS2. The source of transistor PMOS2 is connected to voltage $V_{DD}$ and the source of transistor NMOS2 is connected to voltage GND. The drains of transistors PMOS2 and NMOS2 are also interconnected at a node 02.

Similarly, inverter 4 includes transistors PMOS4 and NMOS4 connected like transistors PMOS2 and NMOS2, the gates of transistors PMOS4 and NMOS4 being connected to terminal O2 and the common drain of transistors PMOS4 and NMOS4 being connected to terminal O4.

In a first state, corresponding to the storage of a first item of data, transistors PMOS2 and NMOS4 are on while transistors NMOS2 and PMOS4 are off, and in a second state corresponding to the storage of the complementary data, transistors PMOS2 and NMOS4 are off while transistors NMOS2 and PMOS4 are on. Tile state in which transistors PMOS2 and NMOS4 are on and transistors NMOS2 and PMOS4 are off has been shown as an example. Then, transistors PMOS2 and NMOS4 substantially correspond to a short-circuit schematized by dotted lines and transistors NMOS2 and PMOS4 correspond to resistors RDS2 and RDS4.

The equivalent diagram of the memory point is then such as shown in FIG. 3. Generally, it should be noted that any memory point of the type of that in FIG. 2, whatever its programming state, has as an equivalent diagram to what is shown in FIG. 3, that is, two parallel resistors of substantially equal value R.

FIG. 4A shows a column formed of n memory points of the type of that in FIG. 1 supplied between voltage $V_{DD}$ and ground GND.

FIG. 4B shows an equivalent electric diagram in steady state of the column of FIG. 4A. 2n resistors of value R are connected in parallel between the supply terminals. The equivalent resistor has a value R/2n.

Each column will conduct a leakage current equal to $(2n/R)V_{DD}$. The leakage current increases with the value of $V_{DD}$ and with the number of cells. It decreases when the values of the resistors in the off state of each transistor increase. Given the proportionality between the leakage current and the number of cells in a column, it should be clear that the larger the memory size, the more serious this leakage current and memory power consumption problem becomes. This problem is most serious in the case of portable devices, the memories of which are supplied by batteries.

For a memory of given size, it is obvious that to reduce the power consumption, the off-state resistance of each element has to be increased or the memory supply voltage has to be decreased. Studies made in both directions have come across serious difficulties.

To increase the off-state resistance of each transistor in a circuit raises difficult technological problems. Especially, in the case of a CMOS technology, even though increasing the resistance of the transistors of one conductivity type is relatively easy, it is difficult to simultaneously increase the resistance of the transistor of opposite type.

As concerns voltage $V_{DD}$ applied to a memory cell, it is imposed by the cell operation. It has however been devised to implement, for memories, as is already well known for logic circuits in general, a stand-by mode. In this stand-by mode, the reduced voltage would be applied during the inactive phases of the circuit, that is, in the case of a memory outside read and write phases. However, this solution has been discarded since, when the voltage across a memory point decreases below a given threshold, the memory point is likely to return to a basic state or to switch states in response to disturbances.

SUMMARY OF THE INVENTION

An object of the present invention is to provide a memory structure that can be set to a stand-by mode without adversely affecting the reliability of the data, that is, without increasing the probability for information contained in the memory points to be lost.

Another object of the present invention is to provide such a memory that can be manufactured by using conventional manufacturing methods.

To achieve these and other objects, the present invention provides a SRAM including an array of memory cell lines and columns, each column being supplied between a high supply voltage and a low supply voltage, which includes at least one MOS transistor in series with each column, and means for applying to said at least one MOS transistor a turn-off control signal to enter a stand-by mode, whereby the overall resistance of the column and of said at least one transistor increases in stand-by mode.

According to an embodiment of the present invention, said at least one transistor includes a first P-channel MOS transistor, arranged on the high supply voltage side, and a second N-channel MOS transistor, arranged on the low supply voltage side.

According to an embodiment of the present invention, the memory includes a first forward-biased diode, in parallel with the first transistor, and a second forward-biased diode, in parallel with the second transistor.

According to an embodiment of the present invention, each memory point of the memory includes two inverters in anti-parallel, the input of the first inverter and the output of the second inverter being connected to a first bit line via a first switch, the input of the second inverter and the output of the first inverter being connected to a second bit line via a second switch.

According to an embodiment of the present invention, each inverter includes a P-channel MOS transistor and an N-channel MOS transistor.

According to an embodiment of the present invention, said at least one transistor is chosen so that its gate is longer than the gates of the transistors of same type of the memory cells.

The foregoing objects, features and advantages of the present invention, will be discussed in detail in the following non-limiting description of specific embodiments in connection with the accompanying drawings.

BRIEF DESCRIPTION OF THE DRAWINGS

FIG. 5 shows a column of memory cells according to the present invention;

FIG. 6 shows the equivalent steady-state electric diagram of the column of FIG. 5. set to a stand-by mode;

DETAILED DESCRIPTION

Figure 1:
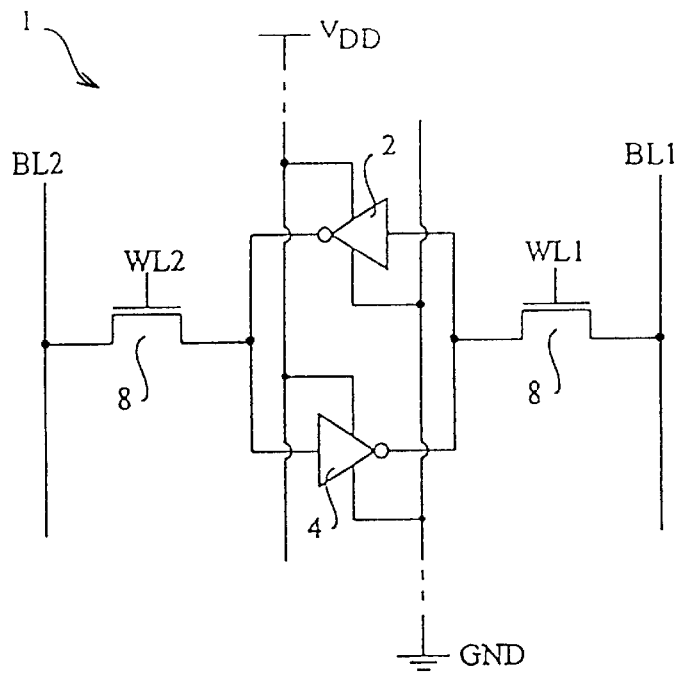
FIG. 1, previously described, shows a conventional SRAM memory point.
Figure 2:
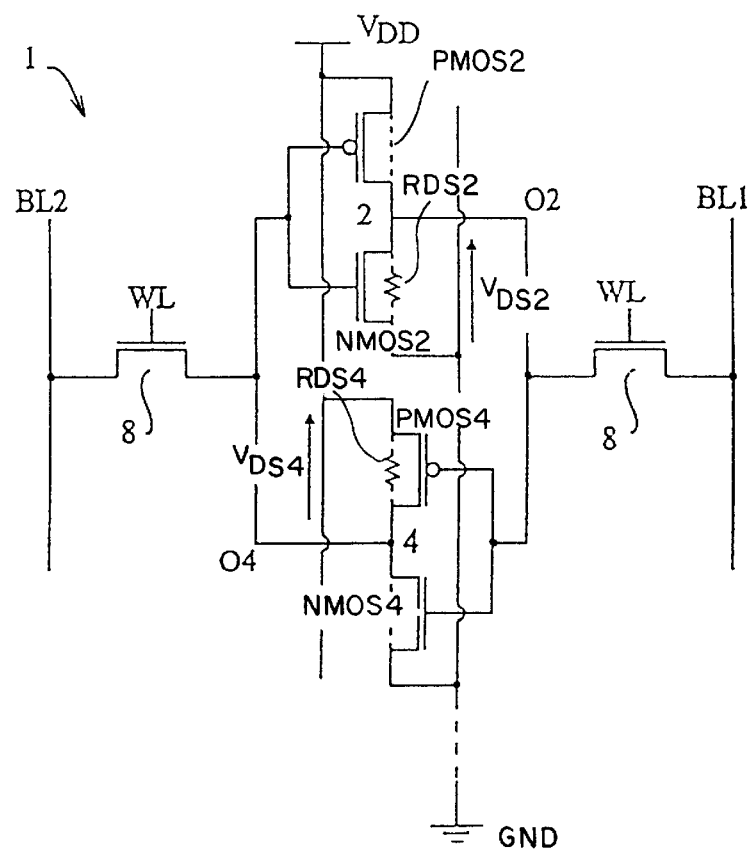
FIG. 2, previously described, shows the memory point of FIG. 1 in further detail.
Figure 3:
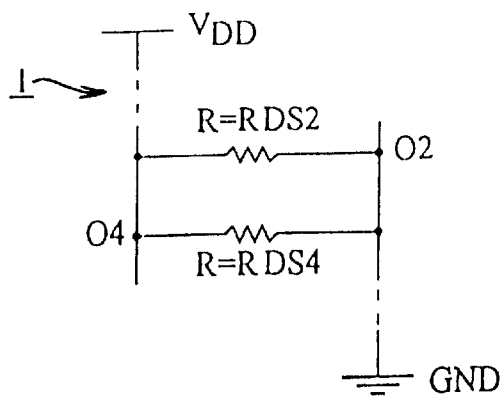
FIG. 3, previously described, shows an equivalent steady-state electric diagram of the memory point of FIG. 2.
Figure 4A:
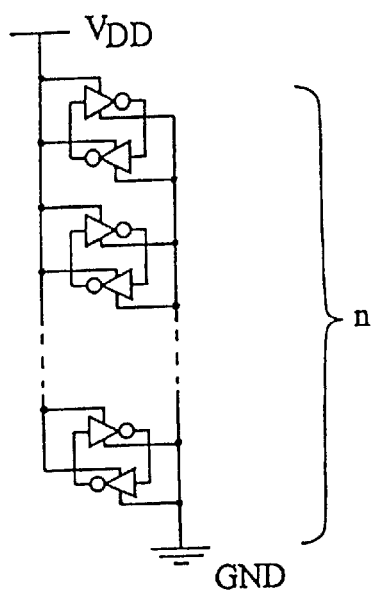
FIGS. 4A and 4B, previously described, show a memory cell column and its equivalent steady-state electric diagram.
Figure 4B:
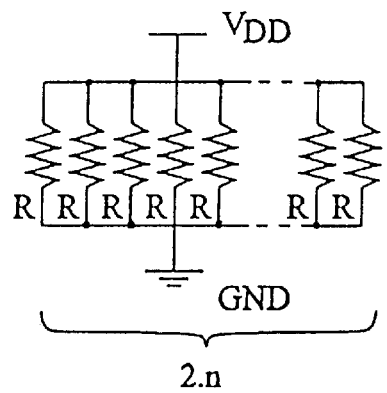

Conversely to prior art methods according to which it is not possible to provide a stand-by mode for SRAMs, the present invention provides a specific stand-by mode in which the leakage resistance of each column of an SRAM is increased, while maintaining a sufficient voltage across the memory cells.

Thus, as illustrated in FIG. 5, the present invention provides arranging, in series with a SRAM cell column 10, complementary MOS switches 12 and 14. More specifically, a P-channel MOS transistor 12 is arranged between the top of the column and terminal $V_{DD}$ and an N-channel MOS transistor 14 is arranged between the bottom of column 10 and terminal GND. Thus, the column, instead of being connected between potentials $V_{DD}$ and GND, is connected between potentials $V_{DDI}$ and $GND_I$. The voltage between $V_{DD}$ and $V_{DDI}$ corresponds to the voltage drop in transistor 12 and voltage $GND_I$ corresponds to voltage GND plus the voltage drop in transistor 14.

In a normal operating mode, transistors 12 and 14 are on and the column operates exactly like a conventional column in read/write modes.

When it is desired to switch to stand-by, turn-off voltages are applied to transistors 12 and 14. In this state, the equivalent steady-state diagram of the circuit is such as illustrated in FIG. 6. A resistor $R_1$ corresponding to the resistance of transistor 12, a resistor R/2n corresponding to the resistance of the n cells of column 10, and a resistor $R_1$ corresponding to the resistance of transistor 14 are successively present between voltages $V_{DD}$ and GND.

A quick reasoning would lead to say that resistances R and $R_1$ are substantially equal and that the voltage across transistors 12 and 14, proportional to the off-state resistance of these transistors, is thus very high as compared to the voltage drop V across the resistor R/2n of column 10, and more specifically that it is 4n times as high. According to this reasoning, voltage V across column 10 would be substantially 4n times smaller in steady state than in normal operation. Such an operation would be unacceptable since the voltage applied to each of the inverters forming the column cells would then be insufficient to maintain the state of these inverters, and by all means to immunize the state of these inverters against disturbances.

The present inventor has shown that the above quick reasoning is erroneous. A generally neglected feature of MOS transistors must indeed be taken into account, that is, the leakage resistance between the drain and the source of a MOS transistor in the off state decreases when the drain-source voltage of this transistor increases. Taking account of this feature, the equivalent diagram shown in FIG. 6 must be reconsidered. If, as seen previously, voltage V across column 10 decreases, value R of the drain-source resistance of each off transistors of a cell increases, since the voltage across this cell decreases. This resistance increase tends to reduce leakage across the cell. Symmetrically, values $R_1$ of the resistances of transistors 12 and 14 in the off state take reduced values. A state of equilibrium in which voltage V is only moderately reduced with respect to voltage $V_{DD}$ is then reached. The voltage across the cell thus remains sufficient to maintain the state of the inverters and thus to maintain the stored information. As an example, at equilibrium, the voltage drop in each of transistors 12 and 14 may be on the order of 20% of voltage $V_{DD}$, and residual voltage V across the column will be 60% of voltage $V_{DD}$.

Figure 7A:
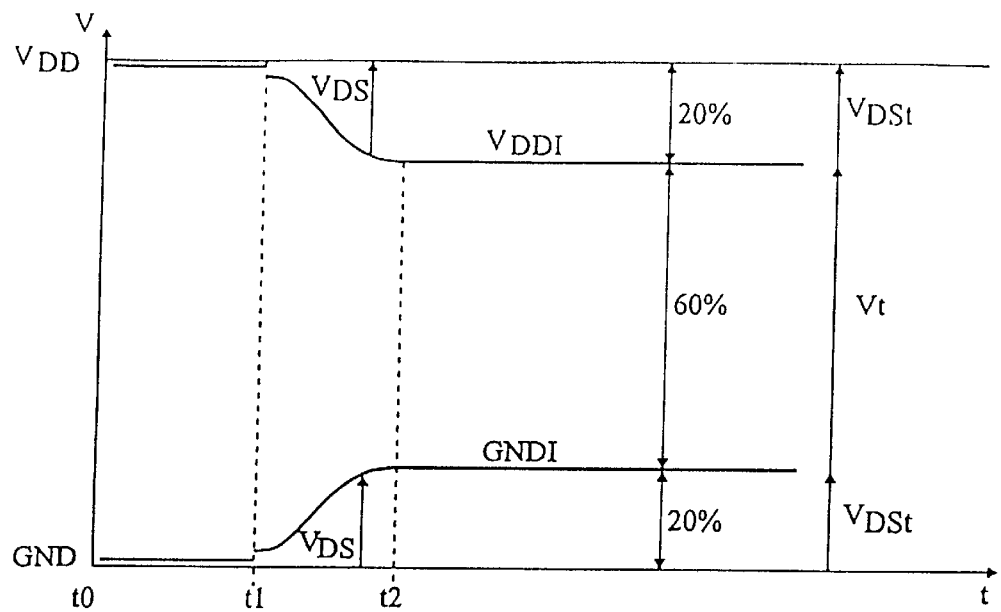
FIGS. 7A, 7B, 7C and 7D show various voltages, resistances and currents for the circuit of FIG. 6 upon a switching to the stand-by mode.
Figure 7B:
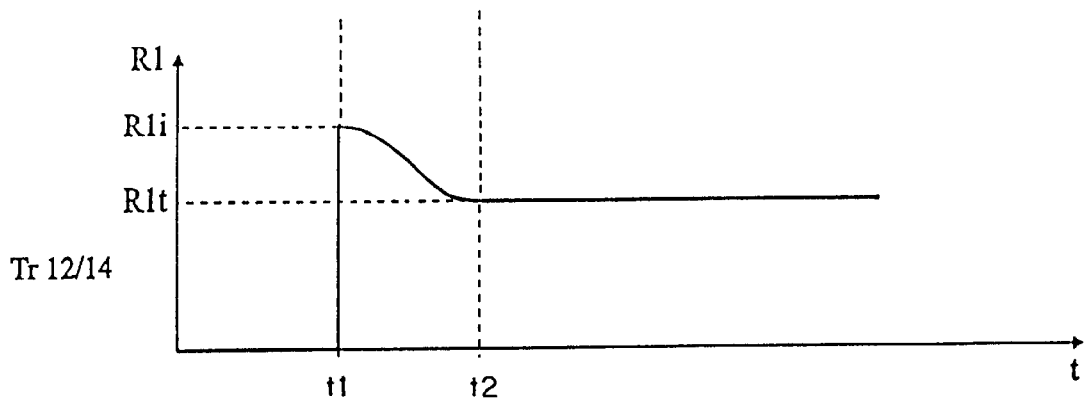
Figure 7C:
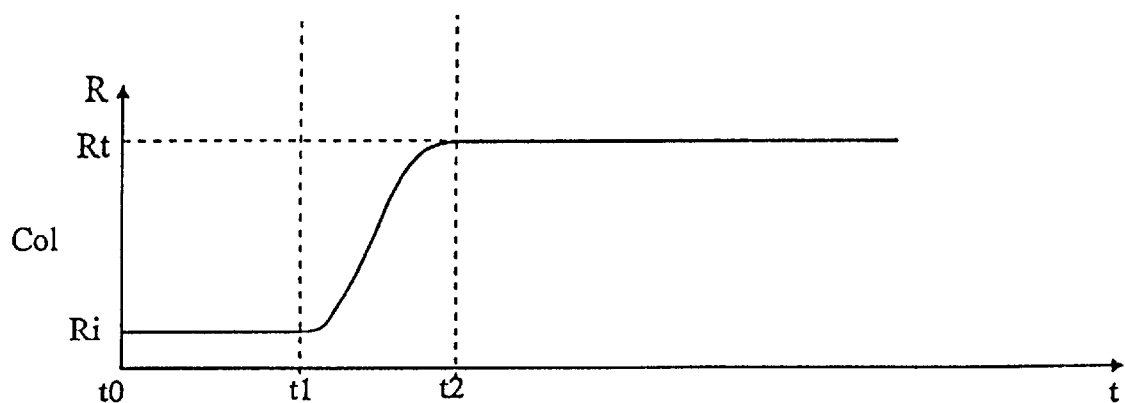

FIG. 7A illustrates in an essentially qualitative way the variation of voltage V across the cells of a column; FIG. 7B illustrates a voltage VDS across transistors 12 and 14 for setting to stand-by; FIG. 7C illustrates resistances $R_1$ and R; and FIG. 7D illustrates current I through a column upon a switching of the column from a normal operating mode to a stand-by mode.

A time $t_0$, column 10 is in normal operating mode. Transistors 12 and 14 are on, and their resistance $R_1$ is practically zero. Leakage resistance R of each of the off transistors of column 10 has a minimum initial value $R_i$, due to the fact that the voltage across the off transistor is maximum (practically equal to $V_{DD}$).

At a time $t_1$, transistors 12 and 14 are turned off to switch to stand-by. Upon switching, drain-source voltage VDS of transistors 12 and 14 being substantially zero, their initial resistance $R_{1i}$ is relatively high. Then, between times $t_1$ and $t_2$, transistors 12 and 14 conducting the leakage current see their drain-source voltage increase, whereby their drain-source resistance $R_1$ decreases from an initial value $R_{1i}$ to a smaller end value $R_{1f}$. Concurrently, voltage V across the transistors of column 10 decreases and the resistance of each off transistor of this column increases between times $t_1$ and $t_2$ from a small value $R_i$ to a greater value $R_f$. Under the influence of these antagonistic phenomena, voltage VDS increases, to reach an equilibrium value determined by the characteristics of transistors 12 and 14 and of the memory column transistors.

Figure 7D:
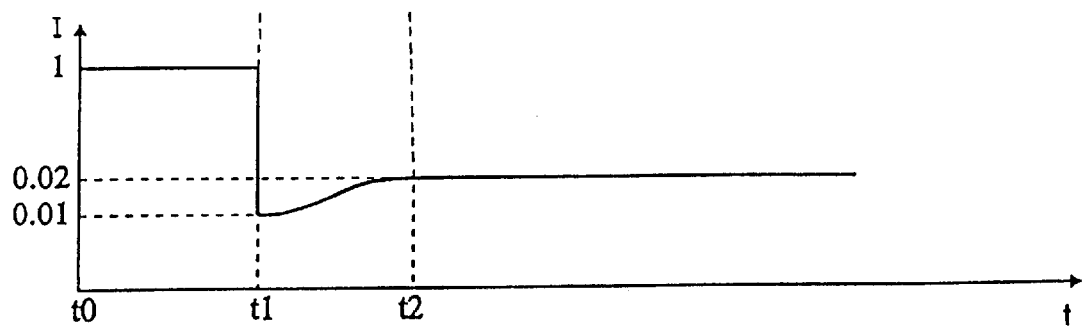

As illustrated by FIG. 7D, during this variation of the voltages and resistances, the leakage current passing through the column abruptly decreases at time $t_1$, then increases back to an equilibrium value smaller than its initial value. As an example, the equilibrium value of the leakage current can be 5 times smaller than before switching to stand-by.

Further, it is desirable that the resistances of transistors 12 and 14 decrease slower than the resistances of the transistors of the cells of the considered column increase. This can be obtained by choosing the form factor of transistors 12 and 14, and especially a gate length greater than that of the transistors of the column memory points.

As an example, transistors 10 of a 0.25-$\mu$m gate length and transistors 12 and 14 of a 0.3-$\mu$m gate length may be used in the column. This enables obtaining a 0.2-V equilibrium voltage $V_{DSt}$ for a 1-V voltage $V_{DD}$.

When leaving the stand-by mode, the voltages and resistances shown in FIGS. 7A–7D have a variation symmetrical to that just described.

It has been seen that a high equilibrium voltage $V_{DSt}$ causes a decrease of voltage V between nodes $V_{DDI}$ and $GND_I$ and can cause a malfunction of the memory column inverters. Now, equilibrium value $V_{DSt}$ depends on the features of transistors 12 and 14, that can vary due to a poor control of the manufacturing method.

Figure 8:
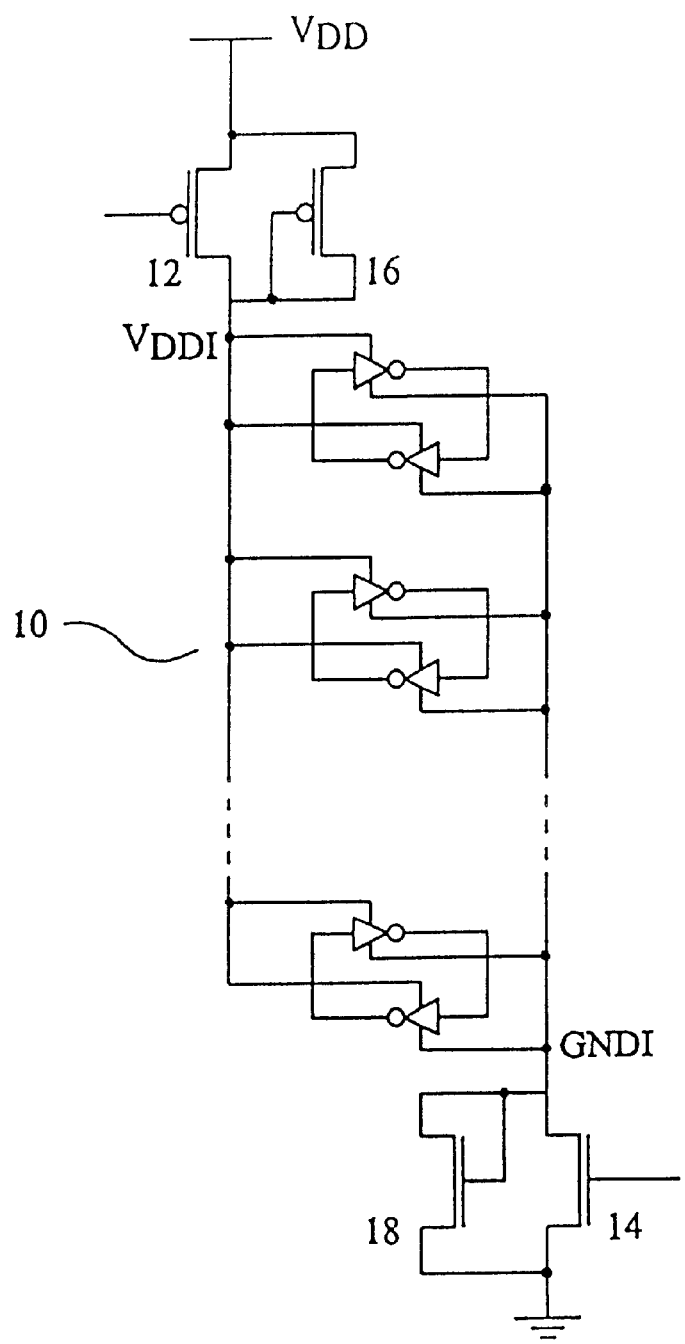
FIG. 8 shows a memory cell column according to an alternative of the present invention.

FIG. 8 shows an alternative of the memory column of FIG. 5, provided with a device for limiting voltage V intended for guaranteeing the operation of the memory column when transistors 12 and 14 are defective.

Respective diodes 16 and 18 of threshold voltage greater than the desired maximum value $V_{DSt}$ are connected in parallel with transistors 12 and 14.

The operation in stand-by mode of the circuit of FIG. 8 is the same as that of the circuit of FIG. 5 if the equilibrium voltage across transistors 12 and 14 is smaller than the diode threshold voltage. However, if this equilibrium voltage exceeds, for any reason, the diode threshold voltage, diodes 16 and 18 turn on. It is thus guaranteed that voltage V is never smaller than $V_{DD}$ minus twice the threshold voltage of a diode.

Of course, the present invention is likely to have various alterations, modifications, and improvements which will readily occur to those skilled in the art. In particular, the foregoing description has been made in relation with a memory in which all the cells in a same column are supplied in parallel, but those skilled in the art will easily adapt the present invention to the case where other sets of cells are supplied in parallel.

Moreover, the foregoing description applies to a memory having all its columns simultaneously set to stand-by as well as to a memory in which only chosen columns are set to stand-by. In this latter case, the setting of a memory column to stand-by can be controlled from the address decoder of the memory.

Further, a CMOS-type structure in which each column is associated, for its setting to stand-by, with a P-channel transistor and with an N-channel transistor has been described. Theoretically, a single transistor would be sufficient.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A SRAM including an array of memory cell lines and columns, each column being supplied between a high supply voltage and a low supply voltage, comprising:

at least one MOS transistor in series with each column, and means for applying to said at least one MOS transistor a turn-off control signal to enter a stand-by mode, wherein the leakage current of said at least one MOS transistor provides, in the stand-by mode, a voltage sufficient to maintain stored information in the cells of said column.

2. The SRAM of claim 1, wherein said at least one transistor comprises:

a first P-channel MOS transistor, arranged on the high supply voltage side, and a second N-channel MOS transistor, arranged on the low supply voltage side.

3. A SRAM including an array of memory cell lines and columns, each column being supplied between a high supply voltage and a low supply voltage, comprising:

at least one MOS transistor in series with each column, further comprising a first P-channel MOS transistor, arranged on the high supply voltage side, and a second N-channel MOS transistor, arranged on the low supply voltage side, and means for applying to said at least one MOS transistor a turn-off control signal to enter a stand-by mode, and a first forward-biased diode, in parallel with the first P-channel MOS transistor, and a second forward-biased diode, in parallel with the second N-channel MOS transistor, wherein the leakage current of said at least one MOS transistor provides, in the stand-by mode, a voltage sufficient to maintain stored information in the cells of said column.

4. The SRAM of claim 1, wherein each memory point includes two inverters in anti-parallel, the input of the first inverter and the output of the second inverter being connected to a first bit line via a first switch, the input of the second inverter and the output of the first inverter being connected to a second bit line via a second switch.

5. The SRAM of claim 4, wherein each inverter includes a P-channel MOS transistor and an N-channel MOS transistor.

6. The SRAM of claim 1, wherein said at least one transistor is chosen so that its gate is longer than the gates of the transistors of same type of the memory cells.

7. The SRAM of claim 1, wherein said at least one transistor comprises:

a second N-channel MOS transistor, arranged on the low supply voltage side.

8. The SRAM of claim 1, wherein said at least one transistor comprises:

a first P-channel MOS transistor, arranged on the high supply voltage side.

* * * * *